United States Patent
Saito et al.

(10) Patent No.: US 7,528,347 B2
(45) Date of Patent: May 5, 2009

(54) COOLING DEVICE AND HEAT TREATING DEVICE USING THE SAME

(75) Inventors: Takanori Saito, Tokyo-To (JP); Kenichi Yamaga, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 849 days.

(21) Appl. No.: 10/505,900

(22) PCT Filed: Feb. 28, 2003

(86) PCT No.: PCT/JP03/02383

§ 371 (c)(1), (2), (4) Date: Aug. 27, 2004

(87) PCT Pub. No.: WO03/073485

PCT Pub. Date: Sep. 4, 2003

(65) Prior Publication Data

US 2005/0225937 A1    Oct. 13, 2005

(30) Foreign Application Priority Data

Feb. 28, 2002 (JP) .............................. 2002-054543

(51) Int. Cl.
*F27B 5/14* (2006.01)
(52) U.S. Cl. ................ 219/390; 219/405; 219/411; 392/416; 392/418; 118/724; 118/725; 118/50.1
(58) Field of Classification Search ............... 219/390, 219/405, 411; 392/416, 418; 118/724–5, 118/50.1
See application file for complete search history.

(56) References Cited

U.S. PATENT DOCUMENTS

| 4,745,088 A | * | 5/1988 | Inoue et al. ................... 117/98 |
| 5,259,883 A | * | 11/1993 | Yamabe et al. ............... 118/725 |
| 5,555,928 A | | 9/1996 | Inaba et al. |
| 6,182,851 B1 | | 2/2001 | Donde |

FOREIGN PATENT DOCUMENTS

| EP | 0 538 471 | | 4/1993 |
| EP | 11-090566 | * | 4/1999 |
| JP | 4-73570 | | 3/1992 |
| JP | 04-101419 | | 4/1992 |
| JP | 08-139081 | | 5/1996 |
| JP | 09-092624 | | 4/1997 |
| JP | 09-251959 | * | 9/1997 |
| JP | 11-90566 | | 4/1999 |

OTHER PUBLICATIONS

International Preliminary Examination Report (PCT/IPEA/409) (translated) issued for PCT/JP2003/002383.
Notification of Transmittal of Translation of the International Preliminary Examination Report (PCT/IB/338) issued for PCT/JP2003/002383.

* cited by examiner

*Primary Examiner*—Shawntina Fuqua
(74) *Attorney, Agent, or Firm*—Smith, Gambrell & Russell, LLP

(57) ABSTRACT

A heat treating device (50) has a cooling sleeve that covers a treating vessel (56) and a heater (100). The cooling sleeve has a cylindrical base member (110) and a cooling pipe (112) spirally wound on the outer peripheral surface hereof. The cooling pipe (112) is brazed to the base member (110).

16 Claims, 6 Drawing Sheets

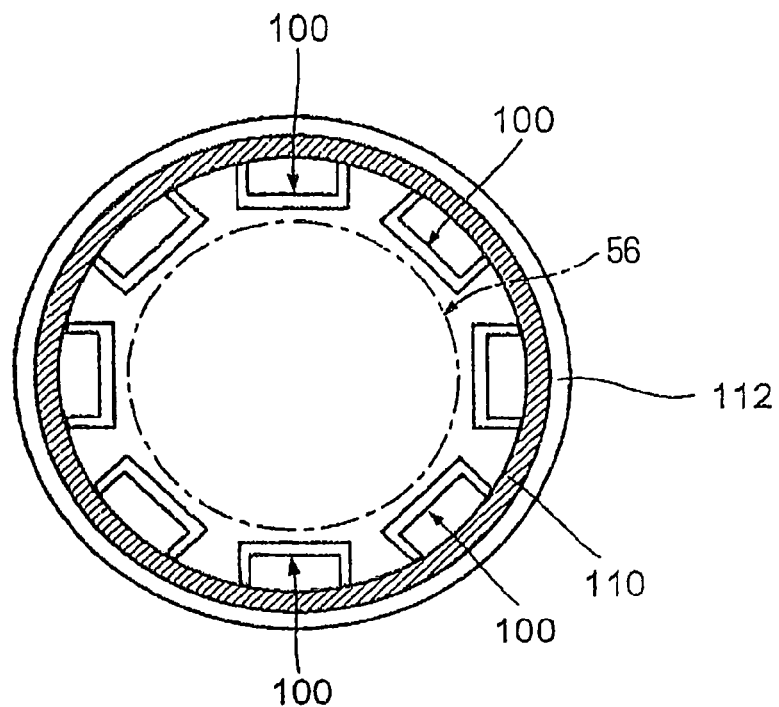
F I G. 2
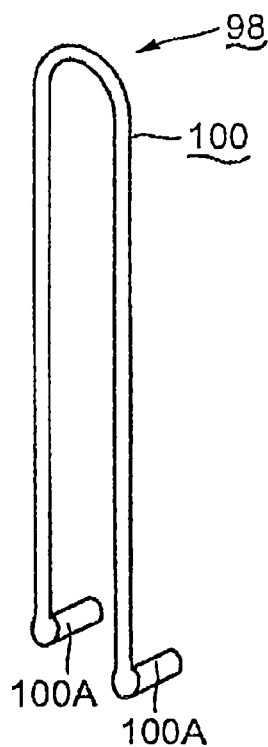
F I G. 3

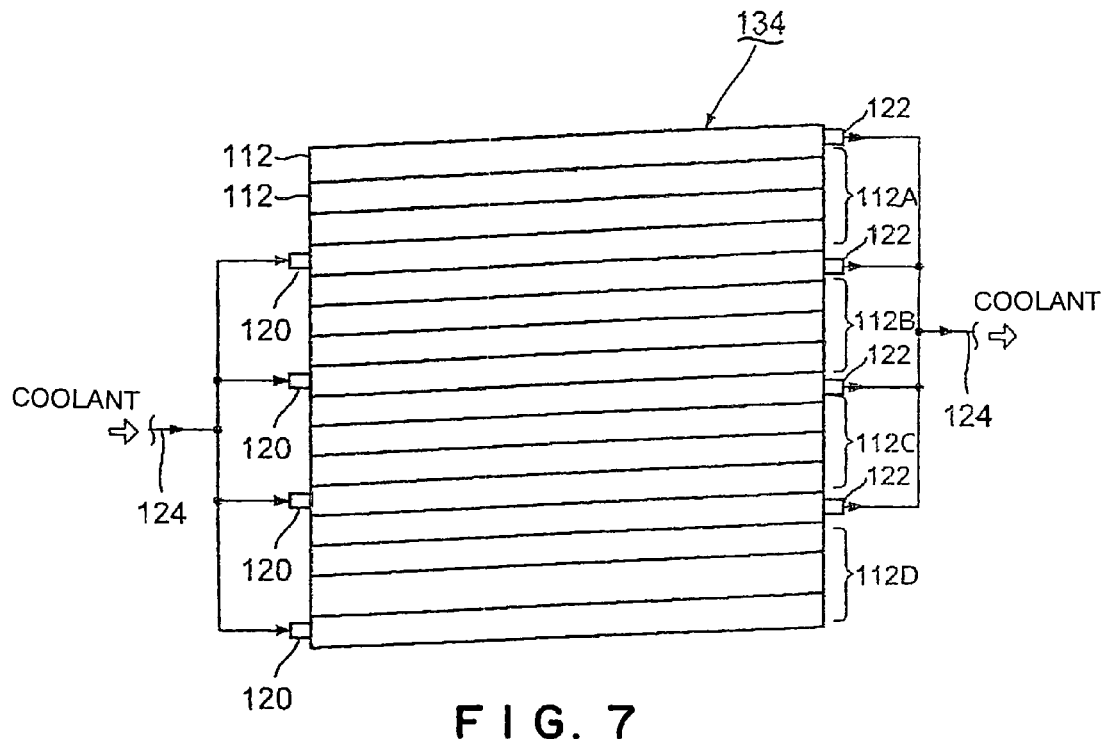
F I G. 7
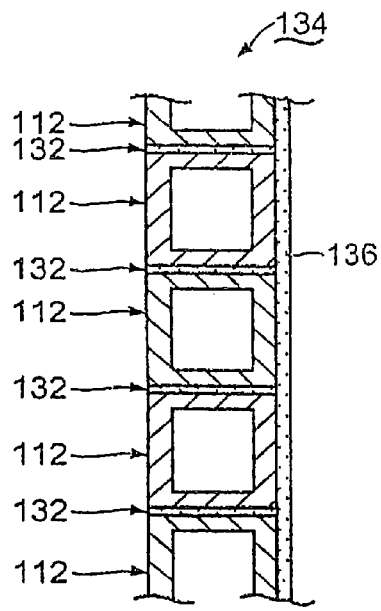
F I G. 8

COOLING DEVICE AND HEAT TREATING DEVICE USING THE SAME

TECHNICAL FIELD

The present invention relates to a thermal processing system for processing objects, such as semiconductor wafers, by a thermal process and a cooling unit to be employed in the thermal processing system.

BACKGROUND ART

In general, a semiconductor wafer is subjected to various thermal processes including a film deposition process, an etching process, an oxidation process, a diffusion process and a modification process to fabricate semiconductor integrated circuits on the semiconductor wafer. When a batch vertical thermal processing system is used for carrying out those thermal processes, semiconductor wafers are transferred from cassettes containing a plurality of semiconductor wafers, for example about twenty-five semiconductor wafers, to a wafer boat. The wafer boat is capable of holding a plurality of semiconductor wafers in the range of about thirty to about one hundred and fifty wafers depending on the size of the wafers. The wafer boat is loaded into a processing vessel from below the processing vessel, and then the processing vessel is sealed hermetically. Then, the semiconductor wafers are processed by a predetermined thermal process, controlling process conditions including flow rates of process gases, process pressure and process temperature.

The conventional processing vessel is surrounded by a heater for heating the wafers, and a heat-insulating layer of a heat-insulating material, such as alumina or silica. The heat-insulating layer serves to keep the processing vessel hot and to ensure the security of space around the processing vessel. Recently, it has been found that there is a possibility that metallic impurities, such as B, Fe and Cu, contained in the hot heat-insulating layer gradually permeate the processing vessel formed of quartz, enter the processing vessel and contaminate the wafers to some extent. A thermal processing system not provided with any heat-insulating layer has been developed to avoid such possibility. In view of improving throughput, it is desired to decrease the heat capacity of the entire processing furnace to enable heating a processing vessel at a high heating rate. From such a viewpoint, a thermal processing system not provided with any heat-insulating layer is desired.

A conventional thermal processing system not provided with any heat-insulating layer like the foregoing heat-insulating layer will be described by way of example with reference to FIG. 9. The thermal processing system 2 has a vertical processing vessel 8 of quartz having a double-tube structure consisting of an inner tube 4 and an outer tube 6. A quartz wafer boat 10 is held in a processing space S defined by the inner tube 4. The wafer boat 10 holds a plurality semiconductor wafers W at vertical intervals.

A cap 12 is arranged to open and close the lower opening of the processing vessel 8. A rotating shaft 16 is connected to the cap 12 through a magnetic fluid seal 14. A rotating table 18 is mounted on top of the rotating shaft 16, and a heat-insulating tube 20 is mounted on the rotating table 18. The wafer boat 10 is mounted on the heat-insulating tube 20. The cap 12 is connected to an arm 24 of a boar elevator 22 which is vertically movable. Thus, the cap 12 can be vertically moved together with the shaft 16 and the wafer boat 10. The wafer boat 10 is inserted through the lower opening of the processing vessel 8 into the processing vessel 8.

A stainless steel manifold 26 is joined to a lower end part of the processing vessel 8. A plurality of gas nozzles, namely, two gas nozzles 28a and 28B in the illustration, for supplying various process gases necessary for a thermal process (e.g., a film forming process) are extended through the manifold 26. Gas supply systems 30A and 30B are connected to the gas nozzles 28A and 28B, respectively. The gas supply systems 30A and 30B are provided with flow controllers 32A and 32B, such as mass-flow controllers, for controlling gas flow rates, respectively.

Process gases supplied through the gas nozzles 28A and 28B into the processing vessel 8 flow upward in the processing space S in the inner tube 4 in which the wafers are held, reverse at the upper end of the processing space S, flow downward through an annular space between the inner tube 4 and the outer tube 6, and are discharged from the processing vessel 8. A discharge port 34 is formed in the side wall of the manifold 26, and a not-shown vacuum pump for evacuating the processing vessel 8 is connected to the discharge port 34. A plurality of bar-shaped heaters 36 each extending vertically are arranged around the processing vessel 8 so as to surround the processing vessel 8. The heaters 36 heat the wafers W held in the processing vessel 8 at a predetermined temperature.

A cylindrical cooling jacket 38 not including any heat-insulating material is arranged outside the heaters 36. The cooling jacket 38 includes a cylindrical stainless steel inner shell 38A and a cylindrical stainless steel outer shell 38B, which define a space therebetween and are joined one another. A plurality of partition plates 40 are welded to the inner shell 38A and the outer shell 38B so as to form a meandering coolant passage 42 in the space between the shells 38A and 38B. When cooling water flows through the coolant passage 42, the cooling jacket 38 functions as a heat-insulating layer to keep a space around the cooling jacket 38 at a safe temperature.

As the pressure of cooling water flowing through the cooling jacket 38 is comparatively high, usually about 5 kg/cm$^2$, the inner shell 38A and the outer shell 38B must have a comparatively high strength to withstand such a high pressure. Therefore, the shells 38A and 38B have a big thickness t on the order of 6 mm. Hence, the cooling jacket 38 is heavy, and consequently, a large, complicated support structure is necessary for supporting the cooling jacket 38. Since the partition plates 40 are welded at a space between the inner shell 38A and the outer shell 38B, the cooling jacket 38 is difficult to fabricate and needs a high manufacturing cost. If defective welding occurs, the cooling water will take a short-cut, and consequently, it is possible that irregular cooling occurs and wafers subjected to the thermal process are heated at widely different temperatures. If welding distortion occurs in or a weld bead is formed on the inner surface of the inner shell 38A facing the processing vessel 8 at a part to which the partition plate 40 is welded, the reflectance changes locally at that part and, consequently, the wafers are heated at different temperatures, respectively.

SUMMARY OF THE INVENTION

The present invention has been made in view of the foregoing problems to solve those problems effectively. Accordingly, it is an object of the present invention to provide a lightweight, highly efficient, highly reliable cooling unit and a thermal processing system employing the same.

To achieve the object, the present invention provides a cooling unit for a thermal processing system including a processing vessel for containing objects to be processed, and a heater for heating the objects contained in the processing vessel, the cooling unit including: a tubular base member adapted to contain the processing vessel and the heater therein; and a pipe member wound around the base member, brazed to a surface of the base member, and adapted to allow a coolant to flow therethrough.

The pipe member may be wound on an outer surface of the tubular base member. The pipe member may be spirally wound on an outer surface of the tubular base member.

The pipe member may include a plurality of pipe segments having separate coolant passages, respectively. In this case, preferably, the coolant is supplied to and discharged from the pipe segments individually. Preferably, the pipe segments are arranged on the tubular base member at different levels, respectively.

The cooling unit of the present invention may further include a coolant supply means for supplying a coolant into the cooling pipe member.

As occasion demands, the inner surface of the tubular base member may be subjected to a surface treatment to increase or decrease the heat reflectance thereof. Possible surface treatments to increase the heat reflectance include a mirror-finishing of the inner surface, and a film forming process for forming a film of a ceramic material or a metal on the inner surface.

The present invention also provides a cooling unit for a thermal processing system including a processing vessel for containing objects to be processed, and a heater for heating the objects held in the processing vessel, the cooling unit including: a cooling tube adapted to contain the processing vessel and the heater therein; wherein the cooling tube has a pipe member, which is coiled to form a tubular member and is adapted to allow a coolant to flow therethrough, surfaces of the pipe member define an outer surface and an inner surface of the cooling tube, and vertically adjacent portions of the pipe member are joined in close contact with each other so that no gap may be formed in the outer and the inner surfaces of the cooling tube.

The cooling unit of the present invention may further include a coolant supply means for supplying a coolant into the cooling pipe member.

The pipe member may be coiled spirally.

The pipe member may include a plurality of pipe segments having separate coolant passages, respectively. In this case, preferably, the coolant is supplied to and discharged from the pipe segments individually. Preferably, the pipe segments are arranged at different levels of the cooling tube, respectively.

As occasion demands, the inner surface of the cooling tube may be subjected to a surface treatment to increase or decrease the heat reflectance thereof.

The present invention provides also a thermal processing system provided with the foregoing cooling unit.

BRIEF DESCRIPTION OF THE DRAWINGS

FIG. 2 is a cross-sectional view of an essential part of the thermal processing system shown in FIG. 1;

FIG. 3 is a perspective view of a heater bar shown in FIG. 1;

FIG. 7 is a side elevational view of the cooling unit shown in FIG. 6;

FIG. 8 is an enlarged sectional view of a part B in FIG. 6; and

DESCRIPTION OF THE PREFERRED EMBODIMENTS

Figure 1:
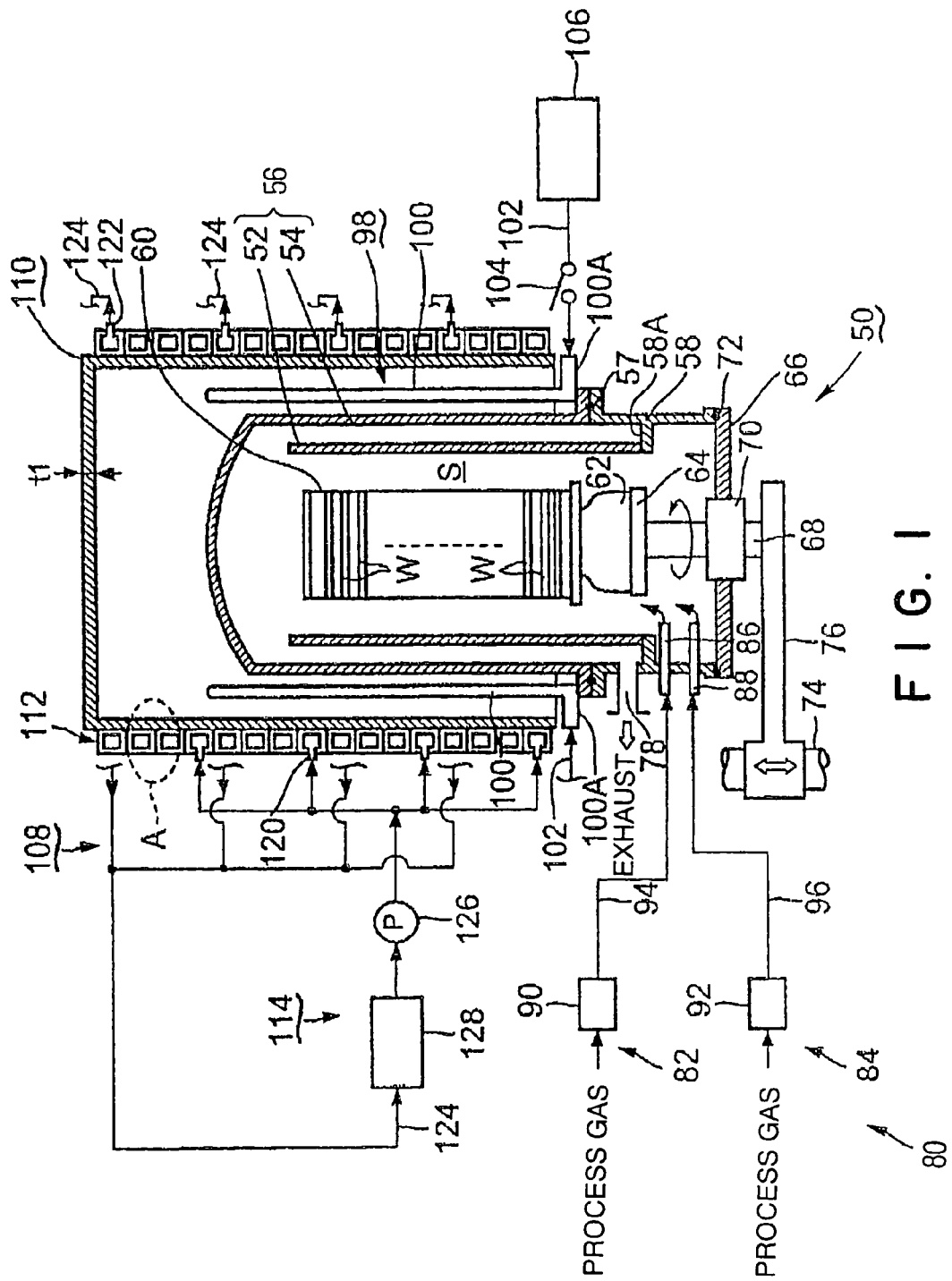
FIG. 1 is a longitudinal sectional view of an essential part of a thermal processing system including a cooling unit in a first embodiment according to the present invention.

A cooling unit and a thermal processing system employing the cooling unit according to the present invention will be described with reference to the accompanying drawings.

First Embodiment

A first embodiment of the present invention will be described with reference to FIGS. 1 to 5. A thermal processing system 50 includes a processing vessel 56 of a double-tube structure. The processing vessel 56 has a tubular inner tube 52 of quartz and an outer tube 54 of quartz arranged coaxially outside the inner tube 52 with a predetermined gap.

A tubular manifold 58 of stainless steel is supported by the lower end of the processing vessel 56 via a sealing member 57, such as an O-ring. The lower end of the inner tube 52 is supported by an annular support plate 58A protruding radially inward from the inner surface of the manifold 58. A quartz wafer boat 60 holding a plurality of semiconductor wafers W (i.e., objects to be processed) at vertical intervals is loaded into the processing vessel 56. In a typical embodiment, the wafer boat 60 holds twenty-five 300 mm diameter wafers W at equal intervals.

The wafer boat 60 (i.e., object holding means) is placed on a rotating table 64 through a heat-insulating tube 62. The rotating table 64 is supported on the top surface of a rotating shaft 68, which penetrates a lid 66 for closing and opening the lower end opening of the manifold 58. A magnetic fluid seal 70 is arranged at a portion of the lid 66 where the rotating shaft 68 penetrates. The magnetic fluid seal 70 seals the rotating shaft 68 hermetically, while permitting the free rotation of the rotating shaft 68. A sealing member 72 such as an O-ring is interposed between the periphery of the lid 66 and the lower end of the manifold 58 to keep the processing vessel 56 hermetically sealed.

The rotating shaft 68 is mounted to the tip of an arm 76 extending from an elevating mechanism 74 generally called a boat elevator. The elevating mechanism 74 is capable of simultaneously vertically moving the wafer boat 60, the lid 66 and so on. The side portion of the manifold 58 is provided with a discharge port 78 to discharge the atmosphere in the processing vessel 56 through the bottom portion of the space between the inner tube 52 and the outer tube 54. An evacuating system including a vacuum pump, not shown, is connected to the discharge port 78. A process gas supply means 80 is connected to the manifold 58 to supply process gases into the inner tube 52. The process gas supply means 80 includes two process gas supply systems 82 and 84 respectively having gas nozzles 86 and 88 penetrating the side wall of the manifold 58. Gas supply lines 94 and 96 respectively provided with flow controllers 90 and 92, such as mass flow controllers, are connected to the gas nozzles 86 and 88, respectively. Thus, the gas supply systems 82 and 84 can supply a plurality of kinds of gases necessary for a thermal process at controlled flow rates. The number of the gas supply systems is not limited to two, but the thermal processing system 50 may be provided with any number of process gas supply systems corresponding to the number of kinds of process gases necessary for the thermal process.

Heating means 98 is arranged outside the processing vessel 56 to heat the semiconductor wafers W. The heating means 98 includes a plurality of, for example, eight heater bars 100 (see FIG. 2) arranged at equal intervals along a circumference around the processing vessel 56. As shown in FIG. 3, each heater bar 100 is bent at the upper portion thereof to be in a U-shape. The vertical length of the heater bars 100 is longer than that of the wafer boat 60. The heater bars 100 are extended vertically and close to the outer surface of the outer tube 54 of the processing vessel 56. Lower ends of each heater bar 100 are bent in an L-shape having end parts 100A. The end parts 100A of the heater bars 100 are fastened to the manifold 58. Thus, the heater bars 100 are supported upright on the manifold 58. Each heater bar 100 may be a carbon wire heater formed by covering a carbon wire with a quartz layer. Each heater bar 100 is connected to a heater power source 106 by a feeder line 102 provided with a switch 104.

The thermal processing system 50 is provided with a cooling unit 108 according to the present invention. The cooling unit 108 includes a tubular member (i.e., base member) 110 surrounding the processing vessel 56 and the heater bars 100, a cooling pipe 112 (i.e. pipe member) wound round and brazed to the side wall of the tubular member 110, and a coolant supply means 114 for supplying a coolant into the cooling pipe 112. In this specification, the assembly of the tubular member 110 and the cooling pipe 112 will be referred to as "cooling tube".

The tubular member 110 has a cylindrical portion serving as a side wall of the tubular member 110, and a ceiling portion closing the upper end opening of the cylindrical portion. The tubular member 110 is formed of a metal, such as aluminum, stainless steel or such. The thickness t1 of the tubular member 110 may be very small, for example, about 1.5 mm.

Figure 4:
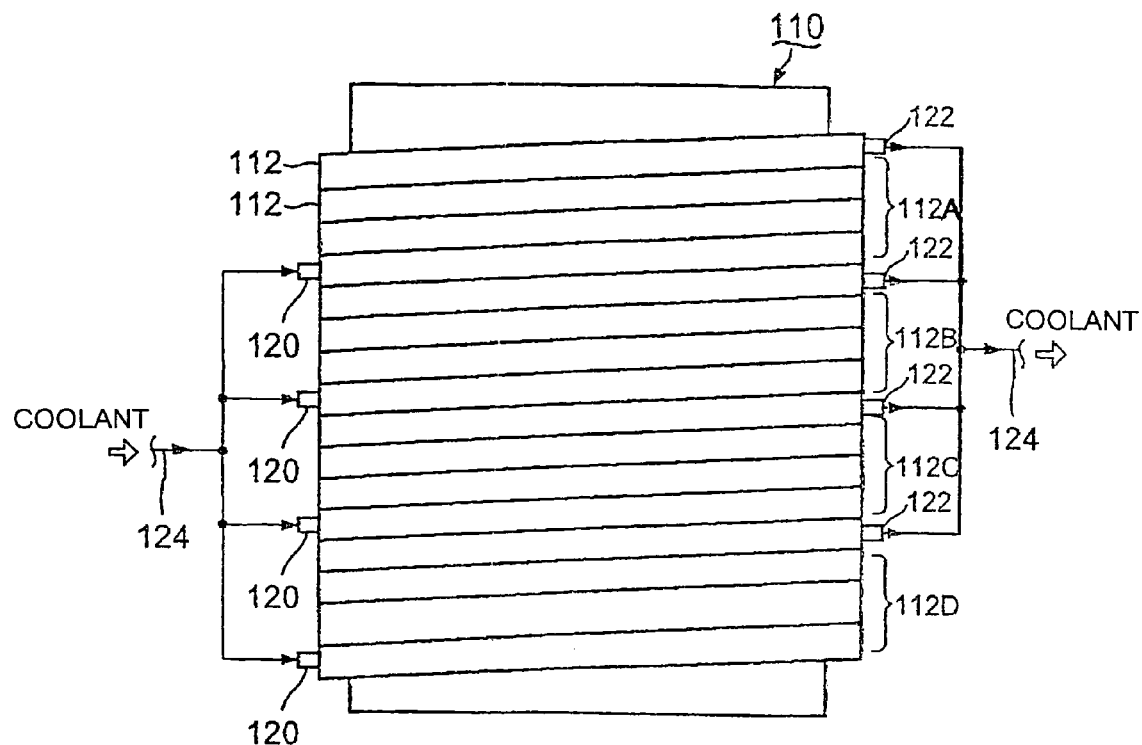
FIG. 4 is a side elevational view of the cooling unit shown in FIG. 1.
Figure 5:
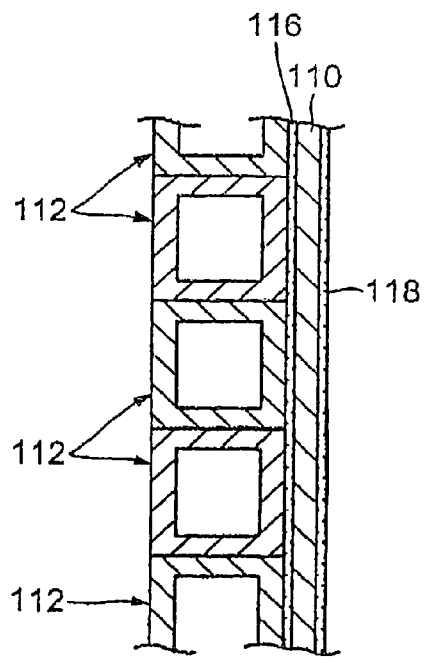
FIG. 5 is an enlarged sectional view of a part A in FIG. 1.

The cooling pipe 112 is formed of a metal, such as stainless steel, aluminum, titanium, copper or such. Preferably, the cooling pipe 112 has a rectangular or square cross section. When the cooling pipe 112 has such a cross section, the cooling pipe 112 can be easily bonded to the tubular member 110 and can have a large contact area, vertically adjacent portions of the cooling pipe 112 can be easily bonded, and gaps are rarely formed between the vertically adjacent portions of the cooling pipe 112. However, the cooling pipe 112 may have a cross section of any shape, such as an elliptic shape, other than the rectangular or square shape. Preferably, the cooling pipe 112 is wound helically on the side wall, preferably on the outer surface of the side wall so as to cover the side wall substantially entirely. Although it is preferable to wind the cooling pipe 112 such that the vertically adjacent portions of the cooling pipe 112 are in close contact with each other without forming any gaps therebetween as shown in FIGS. 4 and 5, slight gaps are permitted in this embodiment. As shown in FIG. 5, a surface of the cooling pipe 112 facing the outer surface of the side wall of the tubular member 110 is bonded entirely to the tubular member 110 with a brazing filler metal 116. Since the tubular member 110 and the cooling pipe 112 are metallurgically bonded together, a very high heat transfer efficiency can be achieved between the tubular member 110 and the cooling pipe 112.

In the event that vertically adjacent portions contact each other as shown in FIG. 5, it is preferable, in view of enhancing strength, to bond together the vertically adjacent portions of the cooling pipe 112 by welding or brazing. Although not shown in FIG. 5, the vertically adjacent portions of the cooling pipe 112 shall be brazed together if the brazing process is carried out with the arrangement shown in FIG. 5.

When the thermal processing system 50 uses a high process temperature in the range of, for example, about 600 to about 1200° C. for a thermal process, the inner surface of the side wall of the tubular member 110 is subjected to a surface treatment to enhance the heat reflectance of the inner surface. Possible surface treatments include film forming processes, such as plating processes and sputtering processes. By using such a film forming process, a film 118 of a ceramic material, such as titanium nitride, or a metal, such as copper, chromium, nickel or gold, is formed on the inner surface of the side wall of the tubular member 110 (see FIG. 5). Due to the provision of the film 118 having a high heat reflectance, heat rays which are radiated by the heater bars 100 and the processing vessel 56 and fall on the tubular member 110 are reflected toward the heater bars 100 and the processing vessel 56, whereby heating efficiency can be enhanced.

The surface treatments for increasing the heat reflectance include mirror-finishing of the inner surface of the tubular member 110. The mirror-finished surface has a surface roughness Ry less than several micrometers measured on the basis of "Surface Roughness—Definition and Indication" specified in JIS (Japanese Industrial Standards) B0601, 1994. Preferably, the surface roughness Ry of the mirror-finished surface is 5 μm or below, more preferably, 1 μm or below. An optional known polishing method, such as a mechanical polishing method, a chemical polishing method or an electrochemical polishing method, may be used for the mirror-finishing.

When the thermal processing system 50 uses a low process temperature in the range of, for example, about 50 to about 600° C. for a thermal process, the inner surface of the side wall of the tubular member 110 is subjected to a surface treatment for reducing the heat reflectance of the inner surface, such as a blackening process, to increase temperature dropping rate in a low-temperature range. Such a surface treatment may be a coating of a black paint, or a surface-roughening process, such as a thermal spraying process or a blasting process.

Referring again to FIG. 4, the cooling pipe 112 is divided into a plurality of (four, in FIG. 4) segments 112A, 112B, 112C and 112D. The segments 112A to 112D cover four parts at different heights of the processing vessel 56, respectively. An inlet port 120 for introducing a coolant and an outlet port 122 for discharging the coolant are respectively formed at the opposite ends of each segment 112A to 112D of the cooling pipe 112. A single continuous coolant passage may be formed in the cooling pipe 112 without dividing the cooling pipe 112 into plural segments.

Referring to FIG. 1, the coolant supply system 114 includes a coolant circulating line 124 provided with a coolant circulation pump 126 and a cooling heat exchanger 128 for cooling the heated coolant. The supply section of the coolant circulating line 124 is branched into a plurality of branch lines, which are respectively connected to the inlet ports 120 of the segments 112A to 112D of the cooling pipe 112. The return section of the coolant circulating line 124 is branched into a plurality of branch lines, which are respectively connected to the outlet ports 122 of the segments 112A to 112D of the cooling pipe 112. The coolant supply system 114 may be configured so that a coolant once passed through the cooling pipe 112 is discharged from the coolant supply system 114 without circulating the same. The coolant may be water, but is not limitative.

A thermal process to be carried out by the thermal processing system structured as mentioned above will be explained. The wafer boat 60 holding semiconductor wafers W is inserted into the processing vessel 56 from below the processing vessel 56, and then the lid 66 closes the lower end opening of the manifold 58 to seal the processing vessel 56. Subsequently, the interior of the processing vessel 56 is evacuated and is maintained at a predetermined process pressure, electric power is supplied to the heater bars 100 to raise the wafer temperature. After the temperature of the wafers W has been stabilized at the process temperature, predetermined process gases are supplied into the processing vessel 56 at controlled flow rates through the nozzles 86 and 88 of the process gas supply systems 82 and 84 of the process gas supply unit 80.

At the same time, the coolant supply means 114 is operated to supply the coolant through the coolant supply line 124 into the segments 112A to 112D of the cooling pipe 112. Thus, the thermal treatment of the wafers W can be carried out while the cooling unit 108 and ambient space around the cooling unit 108 are maintained at safe low temperatures.

After the thermal process for the wafers W has been completed, the supply of the electric power to the heater bars 100 and the supply of the process gas to the processing vessel 56 are stopped, whereas the supply of the coolant into the cooling pipe 112 is continued to cool the processing vessel 56 and the semiconductor wafers W held in the processing vessel 56 to a predetermined handling temperature. After the wafers W have been cooled to the handling temperature, the processed wafers W are unloaded from the processing vessel 56.

Figure 9:
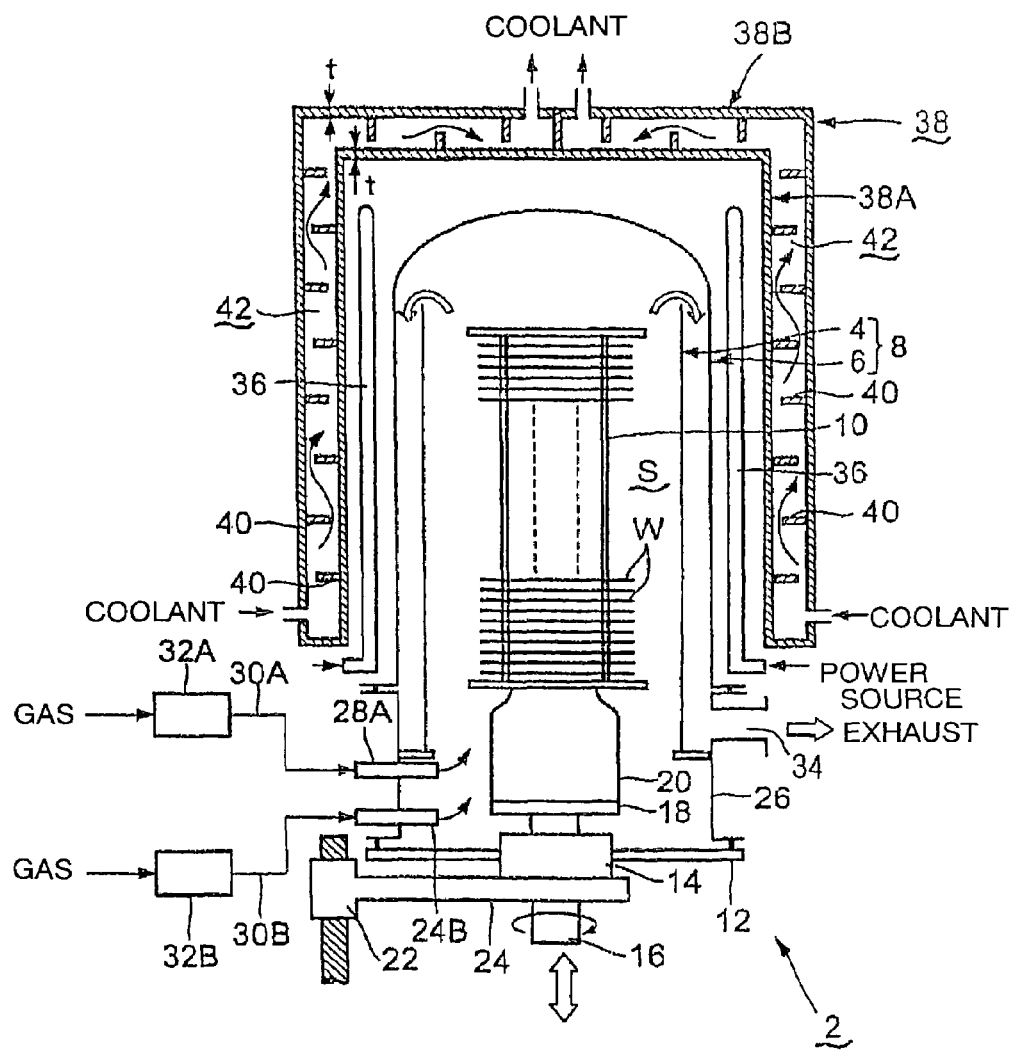
FIG. 9 is a longitudinal sectional view of a conventional thermal processing system.

As mentioned above, the cooling unit 108 of the present invention has the cooling pipe 112 wound around and bonded by brazing to the tubular member 110. Therefore, the cooling pipe 112 is able to withstand the pressure of the coolant satisfactorily even if the cooling pipe 112 has a small wall thickness. Since the cooling unit 108 does not need any member corresponding to the heavy inner shell 38A and the heavy outer shell 38B (see FIG. 9) of the conventional cooling unit, the cooling tube can be light-weight. The cooling unit 108 does not require welding work required by the conventional cooling unit for welding the partition plates 40 to the shells 38a and 38B (see FIG. 9). Thus the cooling unit 108 can be manufactured at a low manufacturing cost, and has improved cooling ability and reliability.

Since the cooling pipe 112 is metallurgically bonded to the tubular member 110 through the brazing filler metal 116, a very high thermal conductivity between the tubular member 110 and the cooling pipe 112 can be achieved, resulting in an enhanced cooling efficiency.

When the cooling unit 108 of the present invention is employed, the processing vessel 56 does not need to be surrounded by a heat-insulating layer having a large heat capacity. Consequently, the heating rate at which the wafers W and the processing vessel 56 are heated can be greatly increased and hence throughput can be improved.

Since the cooling pipe 112 is divided into the plurality of segments 112A to 112D and the coolant is supplied into the segments 112A to 112D individually, vertical distribution of cooling efficiency on the processing vessel 56 is suppressed. Consequently, uneven temperature distribution in a batch of the wafers W can be suppressed, and the wafers W can thus be uniformly processed.

The cooling pipe 112 may be bonded to the inner surface of the side wall of the tubular member 110 instead of bonding the cooling pipe 112 to the outer surface of the side wall of the tubular member 110.

The cooling pipe 112 may be disposed horizontally or vertically spirally instead of spirally winding the cooling pipe 112 around the tubular member 110.

Second Embodiment

A second embodiment of the present invention will be described with reference to FIGS. 6 to 8, in which component parts like or corresponding to those shown in FIGS. 1 to 5 are denoted by the same reference characters and the description thereof will be omitted to avoid duplication.

The cooling tube of the cooling unit in the first embodiment is built by winding the cooling pipe 112 around the tubular member 110 and bonding the cooling pipe 112 to the tubular member 110. In the cooling unit in the second embodiment, a cooling tube (cooling jacket) 134 is formed from only cooling pipes 112 and does not include any member corresponding to the tubular member 110. In the second embodiment, the structure of the cooling unit except for the cooling tube portion, and the structure of the thermal processing system are the same as those in the first embodiment.

In the second embodiment, the cooling tube 134 is fabricated in the following manner. A cooling pipe 112 having a rectangular or square cross section is wound spirally around a vertical axis. Vertically adjacent portions of the cooling pipe 112 are bonded together by brazing using a brazing filler metal 132. The method of bonding together the vertically adjacent parts of the cooling pipe 112 is not limited to brazing; the vertically adjacent parts of the cooling pipe 112 may be bonded together by an optional bonding method, such as a welding method, provided that the joints of the vertically adjacent portions are sufficiently strong.

As shown in FIG. 7, the cooling pipe 112, similarly to the cooling pipe 112 of the first embodiment, is divided into a plurality of, for example, four segments 112A, 112B, 112C and 112D. A coolant supply means 124 supplies a coolant to and discharged from the segments 112A to 112D of the cooling pipe individually.

As shown in FIG. 8, the inner surface of the cooling tube 134, similarly to the first embodiment, is subjected to a surface treatment by providing a coating 136 to increase or to decrease the heat reflectance of the inner surface of the cooling tube 134.

Figure 6:
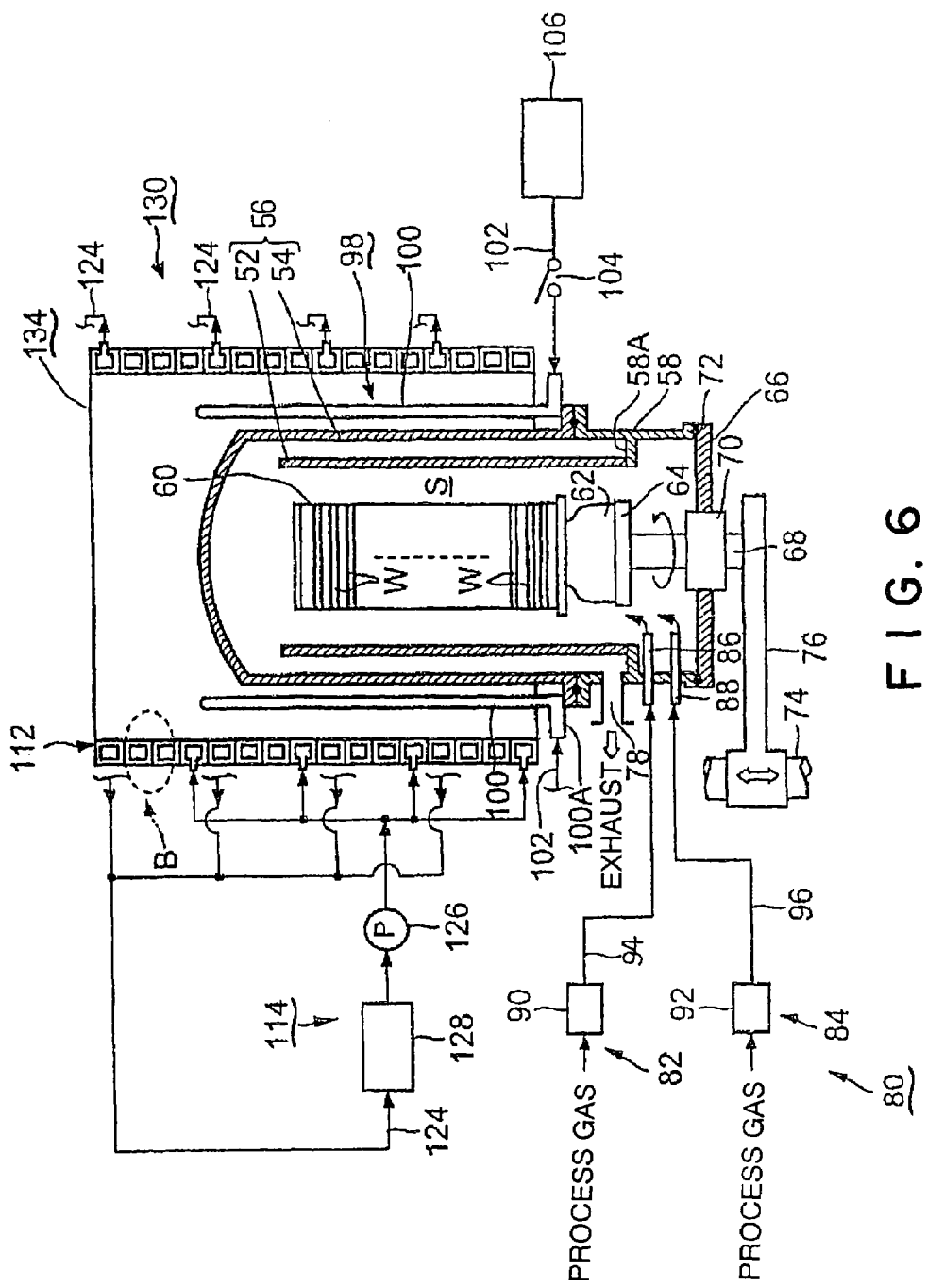
FIG. 6 is a longitudinal sectional view of an essential part of a thermal processing system including a cooling unit in a second embodiment according to the present invention.

The cooling tube shown in FIG. 6 has an opened upper end, which may be closed by a lid.

The advantageous effects of the second embodiment are substantially the same as those of the first embodiment. Since the second embodiment does not have any member corresponding to the tubular member 110 of the first embodiment, the cooling tube of the second embodiment is lighter than that of the first embodiment. Since the cooling tube has a smaller heat capacity, the heating rate and cooling rate can be increased, which enables the further improvement of throughput. The fabricating process is simplified and the manufacturing cost can be reduced. Since the cooling tube of the first embodiment has the tubular member 110, the inner circumference of the cooling tube can be easily smoothed. Consequently, in the first embodiment, the inner circumference of the cooling tube reflects heat rays uniformly, the temperatures of the plurality of wafers W are distributed in a narrow range and each wafer W can be further uniformly heated.

Although the tubular structure is formed by spirally winding the cooling pipe in the first and the second embodiments, the construction of the tubular structure is not limited thereto. For example, the tubular structure may be built by: dividing the cooling pipe into a plurality of pipe segments, bending each of the pipe segments in a ring, vertically stacking the rings of the pipe segments, and bonding together the vertically adjacent rings of the pipe segments. The coolant is supplied into and discharged from the pipe segments individually.

Although the coolant is supposed to be water in the first and the second embodiment, the coolant is not limited to water and any suitable coolant, such as GALDEN® or FLUORINERT®, other than water may be used.

Although the processing vessel 56 in each of the first and the second embodiments has a double-tube structure consisting of the inner tube 52 and the outer tube 54, the processing vessel is not limited thereto and may have a single-tube structure. The objects to be processed are not limited to semiconductor wafers and may be glass substrates or LCD substrates.

What is claimed is:

1. A thermal processing system comprising:
    a vertical processing vessel configured to contain therein process objects at vertical intervals;
    a heater disposed outside the processing vessel to heat the process objects contained in the processing vessel; and
    a vertically-extending, cooling tube surrounding the processing vessel and the heater, said cooling tube including:
    a metallic tubular base member having an inner surface facing the processing vessel and the heater and having an outer surface; and
    a metallic pipe member wound around the outer surface of the base member, brazed to the outer surface of the base member, and configured to allow a coolant to flow therethrough,
    wherein the pipe member has a cross section of a rectangle, and a first surface opposing the outer surface of the base member and corresponding to a side of the rectangle, the first surface of the pipe member being brazed to the outer surface of the base member, whereby the first surface of the pipe member is bonded to the outer surface of the tubular base member via a brazing filler metal, and
    wherein vertically-opposed, adjacent surfaces of the pipe member are bonded to each other via a brazing filler metal.

2. The processing system according to claim 1, wherein the pipe member is spirally wound.

3. The processing system according to claim 1, wherein the pipe member has a plurality of pipe segments having separate coolant passages, respectively.

4. The processing system according to claim 1, wherein the pipe segments are arranged on the tubular base member at different levels, respectively.

5. The processing system according to claim 1 further comprising a coolant supply means for supplying a coolant into the cooling pipe member.

6. The processing system according to claim 1, wherein the inner surface of the tubular base member is subjected to a surface treatment for increasing its heat reflectance.

7. The processing system according to claim 6, wherein the surface treatment is mirror-finishing.

8. The processing system according to claim 6, wherein the surface treatment comprises a ceramic or a metal film formed on the inner surface.

9. The processing system according to claim 8, wherein the film is formed of a material selected from the group consisting of titanium nitride, copper, chromium, nickel and gold.

10. The processing system according to claim 1, wherein an inner surface of the tubular base member is subjected to a surface treatment for decreasing its heat reflectance.

11. A thermal processing system comprising:
    a vertical processing vessel configured to contain therein process objects at vertical intervals;
    a heater disposed outside the processing vessel to heat the process objects contained in the processing vessel; and
    a vertically-extending, cooling tube surrounding the processing vessel and the heater, wherein:
    the cooling tube has a metallic pipe member, which is vertically coiled to form a tubular structure surrounding the processing vessel and the heater, and the pipe member is configured to allow a coolant to flow therethrough;
    the pipe member has a cross section of a rectangle;
    surfaces of the pipe member corresponding to opposite sides of the rectangle and directed in horizontal directions define an outer surface and an inner surface of the cooling tube, respectively;
    vertically-opposed, adjacent surfaces of the pipe member are bonded to each other via a brazing filler metal.

12. The processing system according to claim 11 further comprising a coolant supply means for supplying a coolant into the pipe member.

13. The processing system according to claim 11, wherein the pipe member is coiled spirally.

14. The processing system according to claim 11, wherein the pipe member has a plurality of pipe segments having separate coolant passages, respectively.

15. The processing system according to claim 11, wherein the inner surface of the cooling tube is subjected to a surface treatment for increasing its heat reflectance.

16. The processing system according to claim 11, wherein the inner surface of the cooling tube is subjected to a surface treatment for decreasing its heat reflectance.

* * * * *